United States Patent [19]

Beauducel

[11] Patent Number: 4,849,946

[45] Date of Patent: Jul. 18, 1989

[54] PIEZO-ELECTRIC TRANSDUCER COMPRISING SEVERAL COAXIAL SENSITIVE ELEMENTS

[75] Inventor: Claude Beauducel, Henonville, France

[73] Assignee: Institut Francais du Petrole, Rueil-Malmaison, France

[21] Appl. No.: 212,487

[22] Filed: Jun. 28, 1988

[30] Foreign Application Priority Data

Jun. 30, 1987 [FR] France ............................ 87 09262

[51] Int. Cl.$^4$ ........................................... H04R 17/00
[52] U.S. Cl. .................................. 367/155; 367/159; 367/169; 310/331; 310/800
[58] Field of Search ............... 310/322, 334, 337, 800, 310/330, 331; 367/155, 157, 159, 160, 161, 164, 165, 166, 169, 170; 174/103, 101.5

[56] References Cited

U.S. PATENT DOCUMENTS

| 1,874,281 | 8/1932 | Gilbert | 174/103 X |
| 3,651,243 | 3/1972 | Horner et al. | 174/103 X |
| 3,699,237 | 10/1972 | Melia | 174/101.5 |
| 3,763,464 | 10/1973 | Laurent | 340/10 |
| 3,798,474 | 3/1974 | Cassand et al. | 367/157 X |
| 4,245,172 | 1/1981 | Shirley | 367/157 X |
| 4,599,483 | 7/1986 | Kuhn et al. | 174/103 X |

FOREIGN PATENT DOCUMENTS

| 0174897 | 3/1986 | European Pat. Off. | 367/157 |
| 2556165 | 6/1985 | France . | |
| 6018018 | 11/1986 | Japan . | |
| 0600757 | 1/1986 | World Int. Prop. O. . | |

Primary Examiner—Brian S. Steinberger
Attorney, Agent, or Firm—Antonelli, Terry & Wands

[57] ABSTRACT

Piezoelectric transducer for the production of, for example, hydrophones, with the transducer including a plurality of sensitive coaxial elements interconnected so as to compensate for the effects of accelerations and deflections.

A transducer includes at least one pair of sensitive elements composed of sections of radially polarized coaxial piezoelectric cables having an opposing orientation, with an external armouring of one being connected with an internal armouring of the other, and vice versa. By increasing the number of parts of sensitive elements and selecting the relative disposition, it is possible to improve the immunity of the transducer to noise due to accelerations and deflections, regardless of the direction or the need to license a direction where the transducer is sensitive to such noise. A predetermined number of pairs of sensitive elements can be combined around a central column for accommodating connectors or cables.

To be applied, for example, to the production of hydrophones.

21 Claims, 1 Drawing Sheet

4,849,946

PIEZO-ELECTRIC TRANSDUCER COMPRISING SEVERAL COAXIAL SENSITIVE ELEMENTS

BACKGROUND OF THE INVENTION

This invention concerns a piezoelectric transducer comprising a combination of sensitive coaxial elements.

A piezoelectric transducer can be used, for example, for the measurement of pressures, especially in the fields of oceanography or seismic prospection or even for the measurement of directional stresses.

Piezoelectric transducers generally comprise one or or more sensitive elements each including a substrate possessing piezoelectric properties and two electrodes or armourings disposed on both sides.

The substrate may be produced in the form of ceramic disks with relatively small dimensions and included inside a rigid box provided with one or more sides transparent to acoustic waves. French Pat. No. 2.122.675 provides a piezoelectric sensor where one, and, preferably, two ceramic disks, each provided with electrodes, are secured to two flexible plates opposite each other. At least one of the flexible plates is provided with a thicker rigid peripheral part supported against the other. The disks may be produced by the sintering of powdered materials possessing piezoelectric properties and are extremely sensitive but mechanically fragile.

The substrate may be produced in the form of flexible strips or plates made from a plastic synthetic material upon which a treatment confers piezoelectric properties. The materials generally used are, for example, PVDF (polyvinylidene fluoride), polyethylene, PTFE (polytetrafluorethylene) etc, which are stretched prior to an electric polarization being applied to them.

As specialists already know, it is also possible to use copolymers which crystallize directly in a polarizable form without them firstly needing to be stretched.

By using flexible plates or strips, it is possible to build relatively long continuous hydrophones which produce wave number filterings. Incorporated inside seismic streamers towed by a vessel, they particularly allow for the filtering of certain radio disturbances and facilitate the receiving of signals reflected by discontinuities from the submarine subsurface in response to seismic waves emitted by a towed vessel.

Piezoelectric transducers have already been produced having a coaxial form by using recognized techniques in the field of producing signal transmission cables. The dielectric material disposed between the internal and external armouring is then replaced by a substrate made from a synthetic plastic material, such as those mentioned above, and are radially polarized. The external armouring is sufficiently fine so as to be transparent to acoustic waves. For example, a film of conductive paint or vacuum metallization is used. An impervious elastomer sheath electrically insulates the external armouring. This external armouring and the internal armouring are connected to an impedance corrector preamplifier. As conventional production techniques are used, the cost of coaxial transducers is often less expensive than the price of thin and flat film transducers. Moreover, the outer armouring constitutes a natural electric shielding.

Such coaxial piezoelectric transducers are described, for example, in the U.S. Pat. No. 4,568,851 or the published PCT patent application WO 86/00.757.

Piezoelectric coaxial cables are often unsuitable for use in water when they are subjected to various disturbances. This applies when they are used as hydrophones and towed at sea for the requirements of seismic prospection or for carrying out markings and localizations of sound sources. A radial acceleration provokes an over pressure on one side of the cable and a partial depression vacuum on the other hand. Current charges are generated due to pressure variations. These are of the opposite kind on both sides of the cable, but generally, there is no full compensation. An acceleration thus creates a parasitic voltage. If such a piezoelectric cable undergoes bending or flexion when being towed, compression of the sensitive substrate will be produced on the convex side and an extension on the opposite side. The charges of opposed signs which appear generally no longer compensate for each other. Like radial sensitivity, the parasitic signals generated from accelerations or flexions may even mask the useful signals to be measured.

The piezoelectric transducer according to the invention enables the above-mentioned drawbacks to be avoided.

The piezoelectric transducer of the present invention is produced from sensitive elements with a coaxial structure comprising a substrate including a material possessing piezoelectric properties, each connected to two conductive armourings, one being internal, the other external. These sensitive elements are respectively produced from radially polarized substrates but both being in an opposite direction and their armourings are electrically connected two by two. In accordance with advantageous features of the present invention, a piezoelectric transducer is provided which comprises at least two sensitive elements with substantially identical dimensions disposed close to each other and linked together by a covering material.

The outer armouring of one of the sensitive elements is connected preferably to the inner armouring of the other sensitive element and vice versa. An even number of sensitive elements whose radial polarizations are opposite two by two can be distributed into rings and embedded inside a covering material. They may even be disposed inside a sheath provided with a central recess being used, for example, to have various cables or possibly pipes run through.

The use of sensitive elements with substantially identical dimensions, which, owing to this fact, generate analogous voltages in response to a given stress, are thus able to willingly compensate for the accelerations or flexions which may be applied to them following possibly quite different directions.

Thus, by multiplying the number of sensitive elements, it is possible to obtain a piezoelectric transducer able to effectively compensate for radial flexions or accelerations, irrespective of their application directions. But on the other hand, it is thus possible, by licensing a particular direction, to obtain a piezoelectric transducer able to measure directional stresses.

Other characteristics and the advantages of the transducer according to the invention shall be revealed from reading the description of several embodiments, given by way of examples, which are by no means restrictive, and by referring to the accompanying drawings.

DETAILED DESCRIPTION OF THE INVENTION

Figure 1:
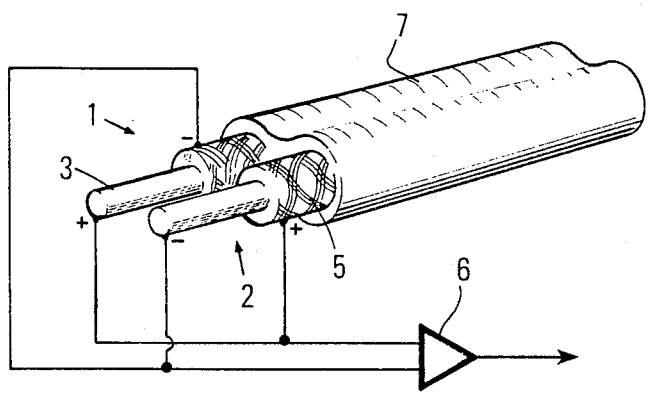
FIG. 1 is a perspective partially schematic view of a piezoelectric transducer provided with two sensitive coaxial elements disposed side-by-side in accordance with the present invention.
Figure 2:
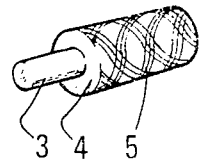
FIG. 2 is a perspective view of a portion of a sensitive piezoelectric element for a piezoelectric transducer constructed in accordance with the present invention.

As shown in FIG. 1, in accordance with the present invention, a piezoelectric transducer comprises two sensitive coaxial elements generally designated by the reference numerals 1,2, with each sensitive coaxial element 1, 2 including, as shown in FIG. 2, an electrode or internal armouring 3 including, for example, a metal wire embedded inside a flexible substance 4 having piezoelectric properties moulded in a cylindrical form. An external armouring 5 is applied against the outer surface of the cylinder.

The flexible substance 4 used may comprise a powder possessing piezoelectric properties such as, for example, PZT, mixed with a flexible bonding material. Thus, it is possible to use in particular a PVDF polymer. The production process includes stretching of the substance embedding the internal armouring 3 so as to orientate its molecules before applying the electric field which provides it with its polarization. The substance 4 can also be made from copolymers of a recognized type selected to directly crystallize in a polarizable form. The outer armouring 5 is made, for example, in the form of a braiding of conductive wires. Preferably, this braiding is embedded inside a layer of a conductive composite material. It may also be made more simply in the form of a thin layer of this same composite material or even of a metal film deposited under vacuum. These production techniques are well-known by specialists and make it possible to continuously produce very large piezoelectric cable lengths.

The two sensitive coaxial elements 1, 2 are cable sections of the same length, but taken from coaxial cables having opposite radial polarizations. In this way, a given stress applied to the two sensitive elements generates current charges with opposite signs on the identical armourings. Then the armourings 3, 5 are interconnected carrying, in this example, charges with the same sign. The external or outer armouring 5 of one is thus electrically connected to the internal armouring 3 of the other and vice versa. Each pair of interconnected armourings is connected to a given terminal of an adapter preamplifier 6. The two coaxial sensitive elements 1, 2 are disposed side by side and combined together by an elastomer insulating sheath 7 transparent to acoustic waves.

With this mode of interconnection, there occurs an increase of the current charges developed on the armourings 3, 5 of the two coaxial sensitive elements 1, 2 by applying pressures which are isotropic variables. It is then possible to experimentally check that the assembly thus constituted offers better immunity to noise due to accelerations and flexions owing due to compensation of the charges which occur. In particular, this is true when a given directional stress provokes compression of one of the two coaxial sensitive elements 1, 2 and stretching of the other.

This especially occurs in embodiment of FIG. 1 where the stresses applied have a component in the plane passing through the axes of the two coaxial sensitive elements 1, 2. When the pressure effects are added and the parasitic stresses are compensated for, the signal-to-noise ratio increases.

Figure 3:
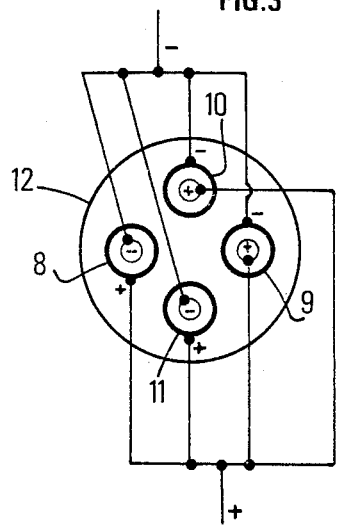
FIG. 3 is a cross-sectional view of a transducer provided with four sensitive elements electrically interconnected in pairs.

It is possible to improve this immunity even further if, within a same sheath, several pairs of coaxial sensitive elements are combined with inverse radial polarizations interconnected as indicated earlier. More particularly, as shown in FIG. 3, four sensitive elements 8, 9, 10, 11 forming two pairs are brought together inside a given sheath 12. These two pairs of sensitive elements 8, 9 and 10, 11 are respectively disposed inside different planes which, for example, may be perpendicular. Similarly, the armourings are interconnected where charges of opposite signs appear for a given acceleration or flexion. Thus, the external or outer armourings of the sensitive elements 8, 11 are interconnected, for example, with the internal armourings of the sensitive elements 9 and 10 and the internal armourings of the same sensitive elements 8, 11 are themselves interconnected to the outer armourings of the sensitive elements 9 and 10. The two interconnections effected are respectively connected to the terminals of an adapter preamplifier (not shown) as in the previous case. Here, one obtains an increase of the signal-to-noise ratio.

The number of sensitive elements may be multiplied to render even less directional the compensation of the accelerations and flexions borne by the transducer and improve its immunity to noises.

Figure 4:
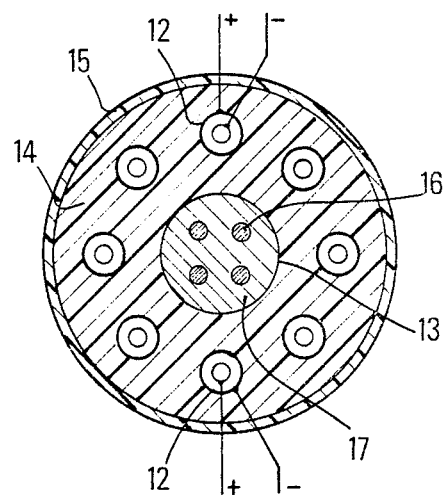
FIG. 4 is a cross-sectional view of a transducer provided with a plurality of sensitive elements distributed inside a sheath in which is arranged a tubular recess for accommodating cables or pipes.

In accordance with the embodiment of FIG. 4, a certain number of pairs of sensitive elements with opposite radial polarizations, for example, four pairs, are disposed around a hollow central column 13 and are each kept in position in relation to the others by means an insulating covering material 14.

The assembly is externally protected by an elastomer sheath 15. The previously defined electrical interconnections are executed so that the current loads appearing on the various armourings due to the accelerations and flexions are compensated. In the central hollow column 13, it is possible to have passed elongated elements 16, such as traction cables, electrical feed cables, signal transmission cables, etc. The various elements passing through the central column are kept in place by the injection into the column of a gel 17, such as silicon gel.

It is thus possible to realize a very long seismic streamer.

One would not be leaving the context of the invention by giving different sensitive elements a configuration so that the transducer is rendered selective to the stresses received along one or more different directions so as to realize, for example, stress gauges. Instead of the ring disposition shown in FIGS. 3 and 4, it is possible to choose another distribution where the sensitive elements are disposed within a given plane or even at different distances from the center.

What is claimed is:

1. Piezoelectric transducer made of a plurality of sensitive elements with a coaxial structure, comprising a substrate made of a material having piezoelectric properties, each of the sensitive elements being connected to two conductive armourings, one of said conductive armourings forming an internal armouring, the other conductive armouring forming an external armouring, said sensitive elements being respectively produced from subtrates radially polarized in opposite directions, said armourings being electrically connected in pairs, wherein the piezoelectric transducer includes at least two substantially identical sensitive coaxial elements, and wherein a covering material joins said at least two identical sensitive coaxial elements to each other such that the sensitive coaxial elements are disposed in close proximity to each other with longitudinal axes of each of the coaxial elements being spaced from each other.

2. Transducer according to claim 1, wherein the outer armouring of one of said sensitive elements is connected to the inner armouring of another one of the sensitive elements and the outer armouring of said another one of the sensitive elements is connected to the inner armouring of said one of said sensitive elements.

3. Transducer according to claim 1, wherein the transducer comprises an even number of pairs off sensitive elements made from subtrates having inverse radial polarizations, said sensitive elements being ring-distributed and embedded inside a covering material.

4. Transducer according to claim 1, wherein the transducer includes an even number of pairs of sensitive elements made from subtrates having inverse radial polarizations, said sensitive elements being disposed inside a sheath and embedded inside a covering material, said sheath being provided with a central recess.

5. Transducer according to claim 4, wherein the central recess is tubular and elongated elements are housed in said recess.

6. Transducer according to claim 5, wherein said recess contains a dielectric substance.

7. Transducer according to claim 4, wherein the sheath is made from a material capable of damping flow noises.

8. Transducer according to one of claims 3, 4, 5, 6 or 7, wherein the armourings of the respective sensitive elements are interconnected so as to mutually compensate current charges appearing on the respective armourings resulting from one of accelerations and flexions along at least one radial plane.

9. Transducer according to claim 3, wherein the sensitive elements are distributed inside a sheath provided with a central recess.

10. Transducer according to one of claims 5 or 6, wherein the elongated elements include one of cables and ducts.

11. Transducer according to claim 4, wherein the sensitive elements are disposed in such a manner that the transducer is rendered selective as to stresses applied in at least one of a plurality of different directions.

12. A piezoelectric transducer comprising a plurality of piezoelectric sensitive coaxial elements with each piezoelectric sensitive coaxial element including a radially polarized tubular substrate, an inner conductive armouring and an outer conductive armouring, said tubular substrates being polarized in two inverse directions, and sensitive elements are polarized respectively along said first direction and said second opposite direction and are aligned in pairs, with said pairs being electrically interconnected said piezoelectric transducer comprising at least one said pair of said sensitive elements each element being identical in size, said sensitive elements are disposed side-by-side and in proximity to each other, and a covering sheath for linking together the sensitive elements of said pair, resulting in a substantially identical electrical response of both sensitive elements.

13. A piezoelectric transducer according to claim 12, comprising an even number of said pairs of sensitive elements ring distributed and embedded inside a common sheath.

14. A piezoelectric transducer according to claim 12, including an even number of said pairs of sensitive elements disposed inside a common sheath and embedded inside a covering material, said sheath being provided with a central recess.

15. A piezoelectric transducer according to claim 14, comprising elongated elements housed in said recess.

16. A piezoelectric transducer according to claim 15, wherein said recess contains a dielectric substance.

17. A piezoelectric transducer according to claim 14, wherein said sheath is made from a material capable of damping flow noises.

18. A piezoelectric transducer according to one of claims 13, 14, 15, 16 or 17, wherein the armouring of the respective sensitive elements are interconnected so as to mutually compensate the current charges appearing on the respective armourings resulting from at least one of accelerations and flexions along at least one radial plane.

19. A piezoelectric transducer according to claim 13, wherein said pairs of sensitive elements are distributed inside a sheath provided with a central recess.

20. A piezoelectric transducer according to one of claims 15 or 16, wherein said elongated elements are formed as one of cables and ducts.

21. A piezoelectric transducer according to claim 14, wherein the sensitive elements are disposed in such a manner that the transducer is rendered selective as to stresses applied in at least one of a plurality of different directions.

* * * * *